United States Patent
Ono

[19]

[11] Patent Number: 6,080,623
[45] Date of Patent: *Jun. 27, 2000

[54] METHOD OF MANUFACTURING CAPACITIVE ELEMENT WITH A NON-DOPED SEMICONDUCTOR FILM TO MINIMIZE NATIVE OXIDE FORMATION

[75] Inventor: Keiichi Ono, Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/733,171

[22] Filed: Oct. 17, 1996

[30] Foreign Application Priority Data

Oct. 24, 1995 [JP] Japan ..................................... 7-299007

[51] Int. Cl.$^7$ .............................................. H01L 21/8242
[52] U.S. Cl. .......................................... 438/254; 438/397
[58] Field of Search ................................ 437/47, 48, 52, 437/60, 919; 438/210, 253, 396, 329, 238–239, 254–256, 381, 397–399

[56] References Cited

U.S. PATENT DOCUMENTS

| | | | |
|---|---|---|---|
| 5,141,892 | 8/1992 | Beinglass ................................ | 437/162 |
| 5,286,668 | 2/1994 | Chou ........................................ | 437/52 |
| 5,436,187 | 7/1995 | Tanigawa ................................. | 437/52 |
| 5,518,946 | 5/1996 | Kuroda ..................................... | 437/52 |
| 5,578,516 | 11/1996 | Chou ........................................ | 437/52 |
| 5,597,754 | 1/1997 | Lou et al. ................................. | 437/52 |
| 5,726,085 | 3/1998 | Crenshaw et al. ...................... | 438/255 |

OTHER PUBLICATIONS

H. Watanabe et al., "A new cylindrical capacitor using hemispherical grained Si (HSG–Si) for 256Mb DRAMs," 1992 IEEE IEDM, pp. 259–262.

Primary Examiner—Joni Chang
Attorney, Agent, or Firm—Ronald P. Kananen; Rader, Fishman & Grauer

[57] ABSTRACT

One electrode of a capacitive element is formed by a doped semiconductor film and a non-doped semiconductor film which covers at least part of the doped semiconductor film, and a capacitive dielectric film is formed to cover these semiconductor films. In forming this capacitive dielectric film, enhanced oxidation due to impurities is suppressed, so hardly any native oxide is formed on the surface of one electrode, and a reliable capacitive element having a large capacitance can be manufactured.

12 Claims, 6 Drawing Sheets

METHOD OF MANUFACTURING CAPACITIVE ELEMENT WITH A NON-DOPED SEMICONDUCTOR FILM TO MINIMIZE NATIVE OXIDE FORMATION

BACKGROUND OF THE INVENTION

1. Field of the invention

The present invention relates to a method of manufacturing a capacitive element in which a first electrode and a second electrode oppose each other through a capacitive dielectric film.

2. Description of the Related Art

FIGS. 1A to 1D show the first related art, exemplifying a method of manufacturing a so-called simply stacked type capacitive element constituting the memory cell of a DRAM (Dynamic Random Access Memory). In this first related art, an $SiO_2$ film 12 and an $Si_3N_4$ film 13, which serve as interlayer dielectric films, are sequentially deposited on an Si substrate 11 having a transistor (not shown) formed thereon, as shown in FIG. 1A.

Subsequently, as shown in FIG. 1B, a contact hole 14 for a lower electrode is formed in the $Si_3N_4$ film 13 and the $SiO_2$ film 12 so as to reach the diffusion layer (not shown) of the transistor. A polycrystalline Si film 15 is deposited, and the polycrystalline Si film 15 is doped with phosphorus 16 or the like by, e.g., ion implantation. Thereafter, as shown in FIG. 1C, the polycrystalline Si film 15 is processed into the shape of a lower electrode.

Next, as shown in FIG. 1D, a capacitive dielectric film 17 is formed on the surface of the polycrystalline Si film 15 and the like. To form this capacitive dielectric film 17, first, the native oxide on the surface of the polycrystalline Si film 15 is removed by hydrofluoric acid or the like. Thereafter, the resultant structure is nitrided by rapid thermal anneal in an $NH_3$ atmosphere at 850° C. for one minute, thereby forming an $Si_3N_4$ film on the surface of the polycrystalline Si film 15.

After an $Si_3N_4$ film is deposited, an $SiO_2$ film is formed on the surface of the $Si_3N_4$ film by pyrogenic oxidation or the like, so that a so-called ON (Oxide-Nitride) film as a composite film of an $SiO_2$ film and an $Si_3N_4$ film is formed as the capacitive dielectric film 17. Thereafter, a polycrystalline Si film 18 is deposited. The polycrystalline Si film 18 is doped with phosphorus by predeposition or the like, and is processed into the shape of an upper electrode.

FIGS. 2A to 2E show the second related art, exemplifying a method of manufacturing a so-called cylindrical type capacitive element constituting the memory cell of a DRAM. In this second related art, an $SiO_2$ film 22 and an $Si_3N_4$ film 23, which serve as interlayer dielectric films, are sequentially deposited on an Si substrate 21 having a transistor (not shown) formed thereon, as shown in FIG. 2A.

Subsequently, as shown in FIG. 2B, a contact hole 24 for a lower electrode is formed in the $Si_3N_4$ film 23 and the $SiO_2$ film 22 so as to reach the diffusion layer (not shown) of the transistor. After the contact hole 24 is filled with a polycrystalline Si plug 25, a BPSG (Boro-Phospho Silicate Glass) film 26 is deposited. Thereafter, as shown in FIG. 2C, a recessed portion 26a matching the shape of a lower electrode is formed in the BPSG film 26. A polycrystalline Si film 27 is deposited and doped with phosphorus or the like.

As shown in FIG. 2D, an $SiO_2$ film 28 is deposited. The $SiO_2$ film 28 is etched back using the polycrystalline Si film 27 as a stopper, thereby filling a recessed portion 27a of the polycrystalline Si film 27 with the $SiO_2$ film 28. The polycrystalline Si film 27 is etched back using the BPSG film 26 as a stopper and the $SiO_2$ film 28 as a mask, thereby fabricating the polycrystalline Si film 27 into a cylindrical shape.

Next, as shown in FIG. 2E, using the $Si_3N_4$ film 23 as a stopper, the BPSG film 26 and the $SiO_2$ film 28 are removed by hydrofluoric acid or the like, thereby forming a lower electrode consisting of the polycrystalline Si film 27. Thereafter, a capacitive dielectric film and an upper electrode are formed following the same procedures as in the first related art, though the film and electrode are not illustrated.

In the first related art shown in FIGS. 1A to 1D, since the polycrystalline Si film 15 is doped with an impurity at a high concentration, enhanced oxidation takes place. In forming the capacitive dielectric film 17, therefore, even after the native oxide on the surface of the polycrystalline Si film 15 is removed by hydrofluoric acid or the like, another native oxide is formed on the surface of the polycrystalline Si film 15 again during the subsequent rinsing process for the hydrofluoric acid.

For this reason, the $Si_3N_4$ film and the $SiO_2$ film are sequentially formed on the native oxide in fact, and an ONO film is undesirably formed as the capacitive dielectric film 17, though an ON film must be formed as the capacitive dielectric film 17.

As a result, the effective thickness of the capacitive dielectric film 17 increases. With the same effective thickness, then, the leakage current flowing through the capacitive dielectric film 17 increases, and the dielectric life of the capacitive dielectric film 17 becomes shorter. It is therefore difficult to manufacture a reliable capacitive element having a large capacitance. The same problems arise in the second related art shown in FIGS. 2A to 2E as well.

SUMMARY OF THE INVENTION

According to a first feature of the invention, a method of manufacturing a capacitive element in which one electrode and the other electrode oppose each other through a capacitive dielectric film, comprises the steps of forming the one electrode by a doped first semiconductor film and a non-doped second semiconductor film which covers at least part of a surface of the first semiconductor film, and forming the capacitive dielectric film to cover the first and second semiconductor films.

According to another feature of the invention, the a method of claim 1 further comprises nitriding surfaces of the first and second semiconductor films to form a first semiconductor nitride film, removing a native oxide from a surface of the first semiconductor nitride film, and thereafter depositing a second semiconductor nitride film on the first semiconductor nitride film, thereby forming part of the capacitive dielectric film.

The method of the invention further comprises oxidizing a surface of the second semiconductor nitride film to form a semiconductor oxide film, thereby forming the capacitive dielectric film consisting of the first and second semiconductor nitride films and the semiconductor oxide film.

According to still another feature of the invention, the method further comprises changing a dose of an impurity during deposition of a semiconductor film, thereby forming the first and second semiconductor films.

The method of the invention further comprises forming the second semiconductor film on a side surface of the first semiconductor film as a side wall of the first semiconductor film.

The first further comprises forming the one electrode of a cylindrical type by the second semiconductor film, the first semiconductor film, and the second semiconductor film, which are sequentially deposited.

In the method of claim 1, the first semiconductor film is doped with an impurity to reduce the electrical resistance of the first semiconductor film constituting one electrode together with the second semiconductor film. At least part of the surface of the first semiconductor film is covered with the non-doped second semiconductor. For this reason, in forming the capacitive dielectric film covering one electrode consisting of the first and second semiconductor films, enhanced oxidation owing to impurities is suppressed, so hardly any native oxide film is formed on the surface of one electrode. As a result, the effective thickness of the capacitive dielectric film is small. With the same effective thickness, then, the leakage current flowing through the capacitive dielectric film is small, and the dielectric life of the capacitive dielectric film is long. Therefore, a reliable capacitive element having a large capacitance can be manufactured.

When the semiconductor nitride film as part of the capacitive dielectric film is to be formed on the surface of one electrode, the surfaces of the first and second semiconductor films are nitrided first to form a first semiconductor nitride film, and the native oxide is removed from the surface of the first semiconductor nitride film. Thereafter, the second semiconductor nitride film is deposited. For this reason, hardly any native oxide is formed on the surface of one electrode, and a more reliable capacitive element having a larger capacitance can be manufactured.

A so-called ON film as a composite film consisting of a semiconductor nitride film and a semiconductor oxide film is formed as the capacitive dielectric film. The leakage current flowing through traps in the forbidden band of the semiconductor nitride film can be limited by the semiconductor oxide film. In addition, pinholes in the semiconductor nitride film can be filled with the semiconductor oxide film, so that a reliable capacitive dielectric film can be formed. Therefore, a more reliable capacitive element can be manufactured.

In forming one electrode, the dose of the impurity is changed during deposition of the semiconductor film. For this reason, the doped first semiconductor film and the non-doped second semiconductor film can be continuously formed. Therefore, one electrode can be formed at a high throughput, and a capacitive element can be manufactured at a low cost.

The second semiconductor film constituting one electrode together with the first semiconductor film is formed as the side wall of the first semiconductor film. The side wall consisting of the second semiconductor film can be formed by depositing the second semiconductor film on the entire surface and etching back the entire surface of the second semiconductor film. For this reason, no mask process is needed in forming the side wall consisting of the second semiconductor film. Therefore, one electrode can be formed at a high throughput, and a capacitive element can be manufactured at a low cost.

The first semiconductor film is covered with the second semiconductor film not only on the side surface of one electrode of a cylindrical type but also on the bottom surface, so hardly any native oxide is formed on the surface of one electrode. Therefore, a more reliable capacitive element having a larger capacitance can be manufactured.

DETAILED DESCRIPTION OF THE PREFERRED EMBODIMENTS

Figure 1A:
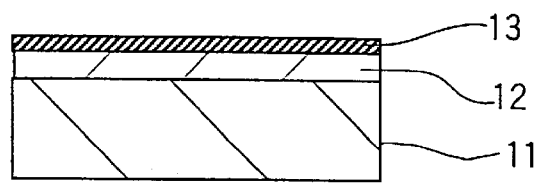
FIGS. 1A to 1D are sectional views showing the manufacturing steps of the first related art.
Figure 1B:
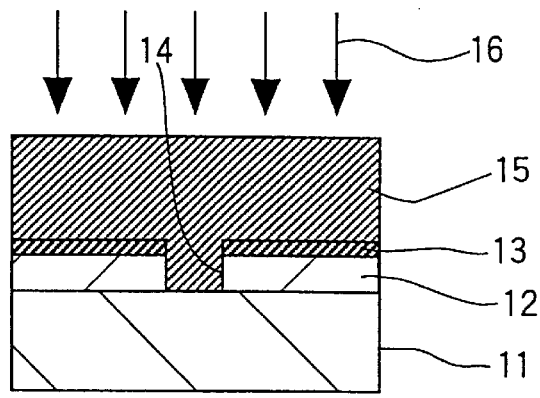
Figure 1C:
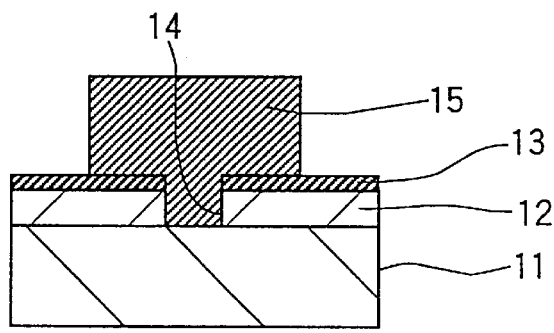
Figure 1D:
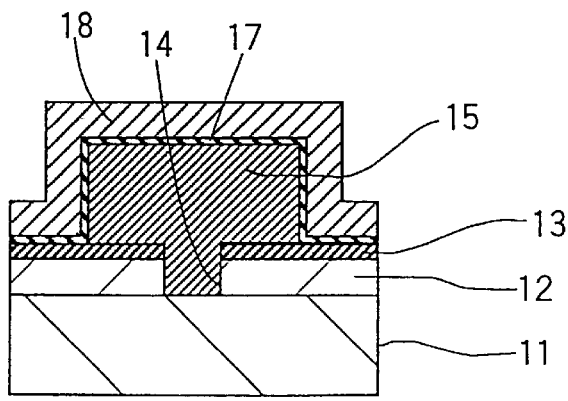
Figure 2A:
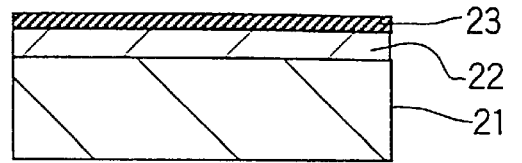
FIGS. 2A to 2E are sectional views showing the manufacturing steps of the second related art.
Figure 2B:
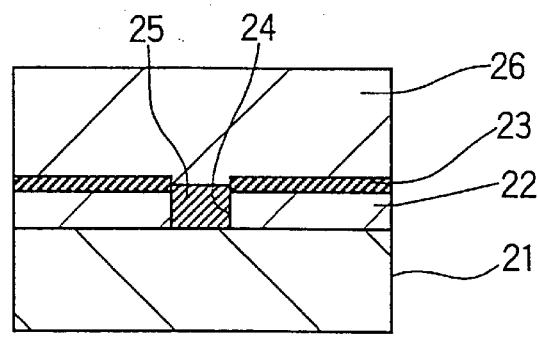
Figure 2C:
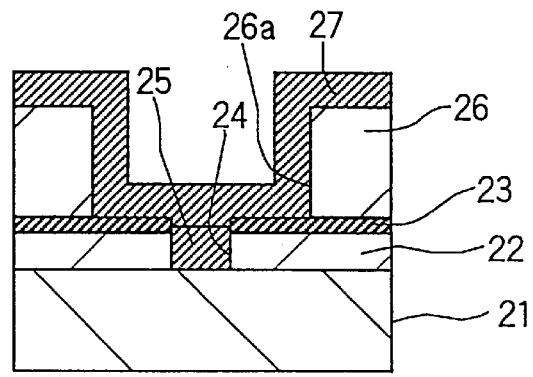
Figure 2D:
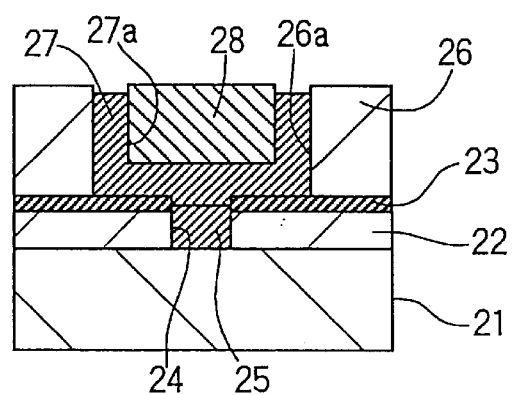
Figure 2E:
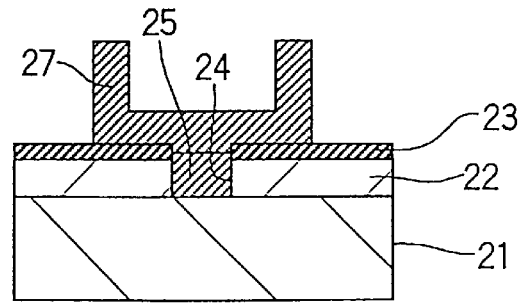
Figure 3:
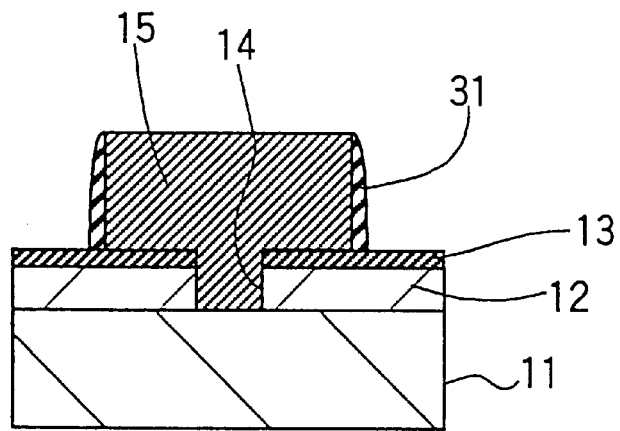
FIG. 3 is a sectional view showing an intermediate state in the manufacturing steps of the first embodiment of the present invention.

The first to fourth embodiments of the present invention applied to the manufacture of a capacitive element constituting the memory cell of a DRAM will be described below with reference to FIGS. 3 to 7. FIG. 3 shows the first embodiment. In this first embodiment, processes up to the fabrication of the polycrystalline Si film 15 into the shape of a lower electrode are substantially the same as those in FIGS. 1A to 1C of the first related art described above.

In the first embodiment, however, a non-doped polycrystalline Si film 31 is deposited, and the entire surface of the polycrystalline Si film 31 is etched back, thereby forming a side wall consisting of the polycrystalline Si film 31 on the side surface of the polycrystalline Si film 15. Thereafter, a capacitive dielectric film is formed by a method shown in FIG. 7 (to be described later). Since the non-doped polycrystalline Si film 31 does not cause enhanced oxidation, hardly any native oxide is formed on the side surface of the polycrystalline Si film 15 on which the polycrystalline Si film 31 is formed.

Figure 4:
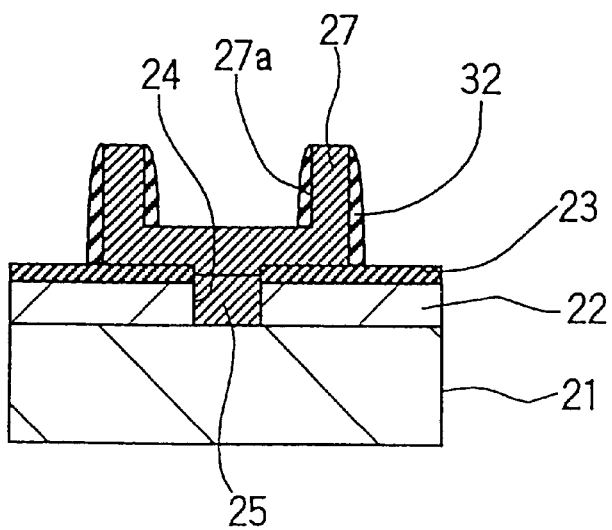
FIG. 4 is a sectional view showing an intermediate state in the manufacturing steps of the second embodiment of the present invention.

FIG. 4 shows the second embodiment. In this second embodiment as well, processes up to the fabrication of the polycrystalline Si film 27 into the shape of a lower electrode are substantially the same as those in FIGS. 2A to 2E of the second related art described above.

In the second embodiment, however, a non-doped polycrystalline Si film 32 is deposited, and the entire surface of the polycrystalline Si film 32 is etched back, thereby forming a side wall consisting of the polycrystalline Si film 32 on the outer side surface of the polycrystalline Si film 27 and the inner side surface of a recessed portion 27a.

Thereafter, a capacitive dielectric film is formed by a method shown in FIG. 7 (to be described later). Since the non-doped polycrystalline Si film 32 does not cause enhanced oxidation, hardly any native oxide is formed on the side surface of the polycrystalline Si film 27 on which the polycrystalline Si film 32 is formed.

Figure 5A:
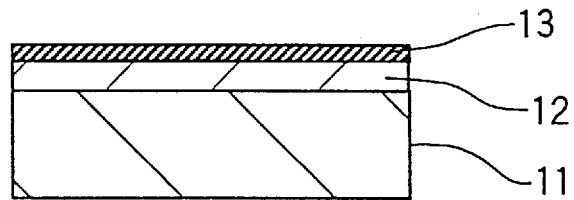
FIGS. 5A to 5C are sectional views showing the manufacturing steps of the third embodiment of the present invention.
Figure 5B:
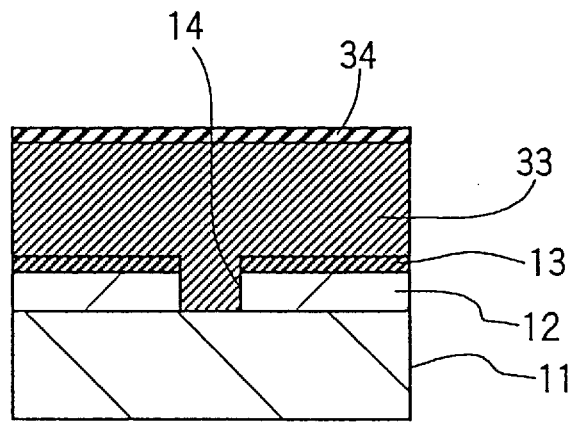
Figure 5C:
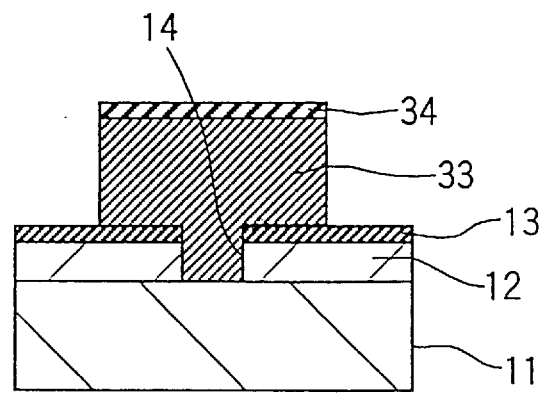

FIGS. 5A to 5C show the third embodiment. In this third embodiment as well, as shown in FIGS. 5A and 5B, processes up to the formation of the contact hole 14 for a lower electrode in the $Si_3N_4$ film 13 and the $SiO_2$ film 12, which contact hole reaches the diffusion layer (not shown) of a transistor, are substantially the same as those in FIGS. 1A and 1B of the first related art described above.

In the third embodiment, however, a polycrystalline Si film 33 doped with phosphorus as an impurity is deposited by CVD using SiH$_4$+PH$_3$ as a source gas, as shown in FIG. 5B. Subsequently, a non-doped polycrystalline Si film 34 is deposited by CVD using only SiH$_4$ as a source gas. As shown in FIG. 5C, the polycrystalline Si films 33 and 34 are fabricated into the shape of a lower electrode.

Thereafter, a capacitive dielectric film is formed by a method shown in FIG. 7 (to be described later). Since the non-doped polycrystalline Si film 34 does not cause enhanced oxidation, hardly any native oxide is formed on the upper surface of the polycrystalline Si film 33 on which the polycrystalline Si film 34 is formed.

FIGS. 6A to 6E show the fourth embodiment. In this fourth embodiment as well, processes up to the formation of the recessed portion 26a matching the shape of a lower electrode in the BPSG film 26 are substantially the same as those in FIGS. 2A to 2C of the second related art described above.

Figure 6A:
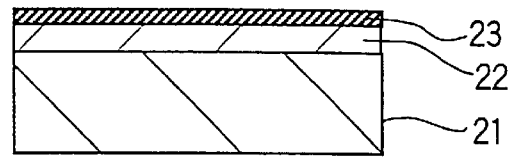
FIGS. 6A to 6E are sectional views showing the manufacturing steps of the fourth embodiment of the present invention.
Figure 6B:
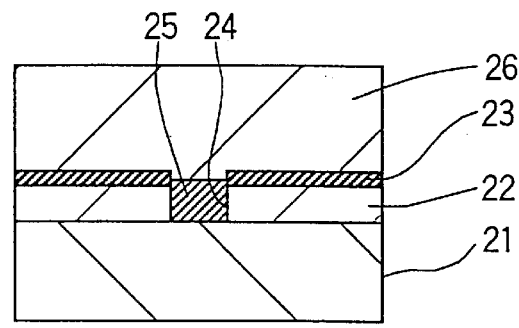
Figure 6C:
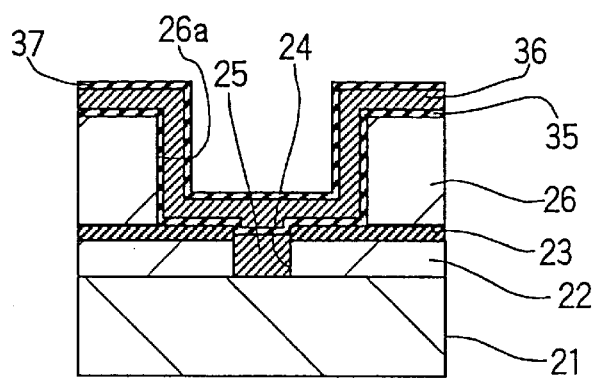

In the fourth embodiment, however, a non-doped polycrystalline Si film 35 is deposited by CVD using only SiH$_4$ as a source gas, as shown in FIG. 6C. Subsequently, a polycrystalline Si film 36 doped with phosphorus as an impurity is deposited by CVD using SiH$_4$+PH$_3$ as a source gas. Furthermore, a non-doped polycrystalline Si film 37 is deposited by CVD using only SiH$_4$ as a source gas.

Figure 6D:
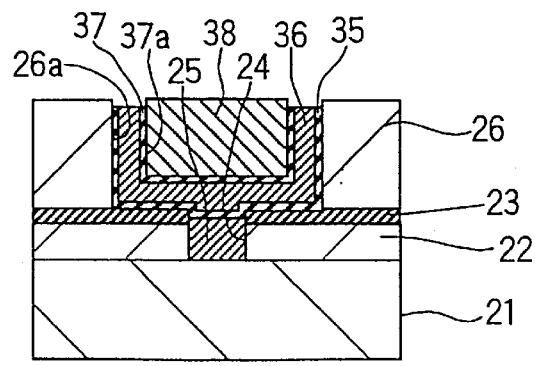

As shown in FIG. 6D, an SiO$_2$ film 38 is deposited. The SiO$_2$ film 38 is etched back using the polycrystalline Si films 37 to 35 as a stopper, thereby filling a recessed portion 37a of the polycrystalline Si film 37 with the SiO$_2$ film 38. The polycrystalline Si films 37 to 35 are etched back using the BPSG film 26 as a stopper and the SiO$_2$ film 38 as a mask, thereby fabricating the polycrystalline Si films 35 to 37 into a cylindrical shape.

Figure 6E:
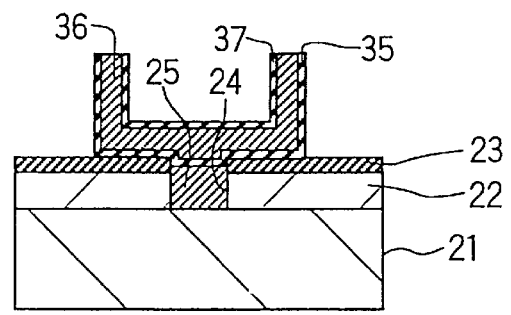

Next, as shown in FIG. 6E, using the Si$_3$N$_4$ film 23 as a stopper, the BPSG film 26 and the SiO$_2$ film 38 are removed by hydrofluoric acid or the like, thereby forming a lower electrode consisting of the polycrystalline Si films 35 to 37. Thereafter, a capacitive dielectric film is formed by a method shown in FIG. 7 (to be described later). Since the non-doped polycrystalline Si films 35 and 37 do not cause enhanced oxidation, hardly any native oxide is formed on the surface of the polycrystalline Si film 36 on which the polycrystalline Si films 35 and 37 are formed.

Figure 7:
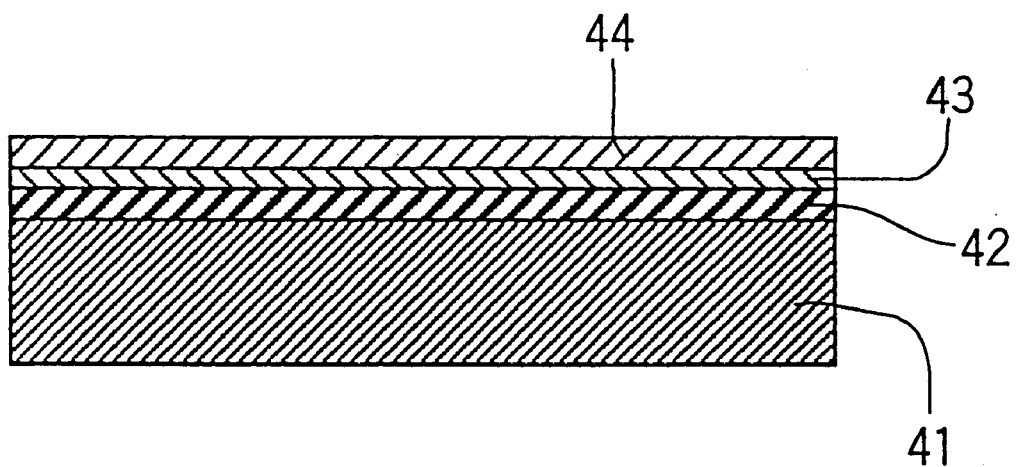
FIG. 7 is a sectional view for explaining a method of forming a capacitive dielectric film common to the first to fourth embodiments.

FIG. 7 shows a method of forming a capacitive dielectric film after at least part of the surface of a polycrystalline Si film 41 doped with phosphorus as an impurity is covered with a non-doped polycrystalline Si film 42, and the lower electrode is formed by these polycrystalline Si films 41 and 42, as in the above-described first to fourth embodiments.

In this method, the native oxide (not shown) on the surface of the polycrystalline Si film 42 is removed by hydrofluoric acid or the like. Thereafter, the resultant structure is nitrided by rapid thermal anneal in an NH$_3$ atmosphere at 850° C. for one minute, thereby forming an Si$_3$N$_4$ film 43 on the surface of the polycrystalline Si film 42. A native oxide 44 is formed on the surface of the Si$_3$N$_4$ film 43 by this rapid thermal anneal. This native oxide 44 is removed by hydrofluoric acid or the like.

Thereafter, an Si$_3$N$_4$ film (not shown) is deposited on the Si$_3$N$_4$ film 43, and an SiO$_2$ film (not shown) is formed on the surface of the Si$_3$N$_4$ film by pyrogenic oxidation or the like, thereby forming an ON film consisting of a composite film of an SiO$_2$ film and an Si$_3$N$_4$ film including the Si$_3$N$_4$ film 43 as a capacitive dielectric film.

In such a method of forming a capacitive dielectric film, the polycrystalline Si film 42 is non-doped. Once the native oxide is removed from the surface of the polycrystalline Si film 42, no native oxide is rapidly formed again on the surface of the polycrystalline Si film 42. Therefore, the Si$_3$N$_4$ film 43 can be efficiently formed by the subsequent rapid thermal anneal, so that the formation of a native oxide on the surface of the polycrystalline Si film 42 can be completely suppressed.

In all of the first to fourth embodiments, after the capacitive dielectric film is formed by the above technique, an upper electrode is formed on the capacitive dielectric film. Note that amorphous Si films or semiconductor films other than Si films may be used in place of the polycrystalline Si films 15, 27, 31 to 37, 41 and 42 of the first to fourth embodiments including the above method of forming a capacitive dielectric film.

In addition, in the above-described first to fourth embodiments, the surface of the polycrystalline Si film 15, 27, 33 or 36 doped with phosphorus as an impurity is not entirely covered by the non-doped polycrystalline Si film 31, 32, 34, 35, or 37. However, the entire surface may be covered, as a matter of course.

Furthermore, in the above-described first to fourth embodiments, the present invention is applied to the manufacture of a capacitive element constituting the memory cell of a DRAM. However, the present invention can be applied to the manufacture of a capacitive element in a semiconductor device other than the DRAM, as a matter of course.

What is claimed is:

1. A method of manufacturing a capacitive element in which a first electrode and a second electrode oppose each other across a capacitive dielectric film, comprising the steps of:

forming said first electrode by
    forming a first non-doped semiconductor film,
    doping said first semiconductor film, and
    subsequent to said doping, forming a non-doped second semiconductor film directly on and on top of at least part of a surface of said first semiconductor film; and forming said capacitive dielectric film on said second non-doped semiconductor film.

2. A method according to claim 1, wherein the step of forming said first electrode comprises forming said second semiconductor film on a side surface of said first semiconductor film as a side wall of said first semiconductor film.

3. A method according to claim 1, wherein the step of forming said first electrode comprises forming said first electrode in a substantially cylindrical shape.

4. The method according to claim 1, wherein said doped first semiconductor film and said non-doped second semiconductor film are each a polycrystalline Si film.

5. The method according to claim 1, wherein said doped first semiconductor film is doped with phospohorus as an impurity.

6. The method according to claim 1, further comprising forming said second electrode on said capacitive dielectric film.

7. A method of claim 1, wherein forming said first electrode further comprises etching said non-doped second semiconductor film to form a side wall consisting of the non-doped semiconductor film on a side surface of the doped semiconductor film, said non-doped semiconductor film not causing enhanced oxidation so that substantially no native oxide is formed on the side surface of the doped semiconductor film on which the non-doped second semiconductor film is formed.

8. The method according to claim 7, wherein the entire surface of the non-doped second semiconductor film is etched back, thereby forming a side wall consisting of the second semiconductor film on an outer side surface of the doped first semiconductor film and an inner side surface of a recessed portion of said doped first semiconductor film.

9. The method according to claim 7, wherein said doped first semiconductor film and said non-doped second semiconductor film are each a polycrystalline Si film.

10. The method according to claim 7, wherein said doped first semiconductor film is doped with phospohorus as an impurity.

11. The method according to claim 1, wherein said forming said capacitive dielectric film further comprises nitriding surfaces of said first and second semiconductor films to form a first semiconductor nitride film, removing a native oxide from a surface of said first semiconductor nitride film, and thereafter depositing a second semiconductor nitride film on said first semiconductor nitride film, thereby forming part of said capacitive film.

12. A method according to claim 11 wherein the step of forming said capacitive dielectric film further comprises oxidizing a surface of said second semiconductor nitride film to form a semiconductor oxide film, thereby forming said capacitive dielectric film consisting of said first and second semiconductor nitride films and said semiconductor oxide film.

* * * * *